(12) United States Patent
Shin et al.

(10) Patent No.: US 11,803,072 B2
(45) Date of Patent: Oct. 31, 2023

(54) DISPLAY DEVICE

(71) Applicant: Samsung Display Co., Ltd., Yongin-Si (KR)

(72) Inventors: Donghee Shin, Asan-si (KR); Geunho Lee, Hwaseong-si (KR); Yonghee Lee, Suwon-si (KR)

(73) Assignee: Samsung Display Co., Ltd., Yongin-Si (KR)

( * ) Notice: Subject to any disclaimer, the term of this patent is extended or adjusted under 35 U.S.C. 154(b) by 103 days.

(21) Appl. No.: 17/079,168

(22) Filed: Oct. 23, 2020

(65) Prior Publication Data

US 2021/0247635 A1 Aug. 12, 2021

(30) Foreign Application Priority Data

Feb. 6, 2020 (KR) .................. 10-2020-0014497

(51) Int. Cl.
*G02F 1/13* (2006.01)
*G01R 31/28* (2006.01)
(Continued)

(52) U.S. Cl.
CPC ....... *G02F 1/1309* (2013.01); *G01R 31/2825* (2013.01); *G02F 1/1339* (2013.01); *G02F 1/133512* (2013.01); *G02F 1/136286* (2013.01)

(58) Field of Classification Search
CPC ................. G02F 1/1309; G02F 1/1339; G02F 1/136286; G02F 1/133512; G02F 1/13458; G02F 1/133388; G02F 1/1345; G02F 1/13338; G02F 1/134309; G02F 1/134345; G02F 1/13452; G02F 2201/122; G02F 2203/01; G02F 2202/28; G02F 1/133502; G06F 1/1637; G06F 1/1601; G06F 2200/1612; G06F 3/0446; G06F 3/0445; G06F 3/0412; G06F 3/044; G06F 3/0448;
(Continued)

(56) References Cited

U.S. PATENT DOCUMENTS 7,202,930 B2 4/2007 Woo et al.
8,937,485 B2 1/2015 Kim et al.
(Continued)

FOREIGN PATENT DOCUMENTS

CN 208077535 U * 11/2018 ......... G02F 1/13458
JP 2006156403 A * 6/2006 ......... H01L 27/3251
(Continued)

*Primary Examiner* — Hoan C Nguyen
(74) *Attorney, Agent, or Firm* — Innovation Counsel LLP

(57) ABSTRACT

Provided is a display device including a display area and a non-display area. The display device comprises a first substrate including a plurality of signal lines which are disposed corresponding to the display area and a plurality of inspection pads which are electrically connected to each of the signal lines and disposed corresponding to the non-display area, a second substrate facing the first substrate and including a light blocking layer which is disposed corresponding to the non-display area, and an encapsulation layer disposed, corresponding to the non-display area, between the first substrate and the second substrate. Each of the inspection pads includes a plurality of opening portions defined spaced apart from each other and a metal pattern portion surrounding the opening portions.

16 Claims, 9 Drawing Sheets

(51) Int. Cl.
  *G02F 1/1362* (2006.01)
  *G02F 1/1339* (2006.01)
  *G02F 1/1335* (2006.01)
(58) Field of Classification Search
  CPC . G06F 2203/04107; G06F 2203/04111; G06F 2203/04101; G06F 3/04164; G01R 31/2825; G09G 3/006; H01L 29/41733; H01L 24/05; H01L 2224/0508; H10K 59/1315; H10K 50/00; H10K 50/813; H10K 59/131; H10K 50/828; H10K 50/824; H10K 59/12; H10K 50/818; H10K 2102/3026; H10K 59/123; H10K 59/122; H10K 59/1201; H10K 50/86; H10K 59/38; H10K 50/865; H05K 3/361; H05K 2201/0108; H05K 3/323; H05K 1/117; H05K 2201/0969; H05K 1/111; H05K 1/144; H05K 2201/10136; H05K 3/368; H05K 2201/042; Y02P 70/50
  See application file for complete search history.

(56) References Cited

U.S. PATENT DOCUMENTS

| | | | |
|---|---|---|---|
| 9,772,523 B2 | 9/2017 | Lim | |
| 2002/0051114 A1* | 5/2002 | Kwak | G02F 1/13458 349/192 |
| 2002/0089614 A1* | 7/2002 | Kim | G02F 1/1309 349/40 |
| 2002/0163615 A1* | 11/2002 | Fujioka | G02F 1/1339 349/154 |
| 2003/0122978 A1* | 7/2003 | Lim | G02F 1/1339 349/42 |
| 2003/0122979 A1* | 7/2003 | Morimitsu | G02F 1/13458 349/42 |
| 2006/0243979 A1* | 11/2006 | Park | H01L 29/78633 257/E27.111 |
| 2007/0013855 A1* | 1/2007 | Ando | G02F 1/1345 349/149 |
| 2010/0258820 A1* | 10/2010 | Kim | G03F 1/50 430/5 |
| 2015/0015529 A1* | 1/2015 | Huang | G06F 3/04164 361/767 |
| 2015/0255487 A1* | 9/2015 | Yoshida | H01L 27/1248 257/43 |

FOREIGN PATENT DOCUMENTS

| | | | |
|---|---|---|---|
| JP | 3859184 B2 | | 12/2006 |
| KR | 20050035682 A | * | 4/2005 |
| KR | 10-0685946 B1 | | 2/2007 |
| KR | 10-2008-0020760 A | | 3/2008 |
| KR | 20080102730 A | * | 11/2008 |
| KR | 10-1113476 B1 | | 3/2012 |
| KR | 10-2016-0124981 A | | 10/2016 |

* cited by examiner

DISPLAY DEVICE

CROSS-REFERENCE TO RELATED APPLICATIONS

This U.S. non-provisional patent application claims priority under 35 U.S.C. § 119 of Korean Patent Application No. 10-2020-0014497, filed on Feb. 6, 2020, the entire contents of which are hereby incorporated by reference.

BACKGROUND

1. Field

The present disclosure generally relates to a display device, and more particularly, to a display device in which a dead space outside a display area is reduced.

2. Description of the Related Art

Various types of display devices have been used to provide image information, and such a display device includes a display area for displaying an image. In the outside of the display area, driving pads for supplying a driving signal to a display unit that displays an image or inspection pads for inspecting whether the display unit is operated are disposed.

Here, a minimum space is required in the outside of the display area so as to dispose the driving pads and the inspection pads. A research has been carried out for increasing a relative proportion of the display area in the display device by minimizing an area in which these pads are disposed and for increasing a degree of freedom in design of the display device by reducing the dead space.

SUMMARY

The present disclosure provides a display device in which a dead space is reduced.

The present disclosure also provides a display device maintaining reliability even while reducing a dead space.

An embodiment of the present disclosure provides a display device including a display area and a non-display area adjacent to the display area, the display device comprising a first substrate including a plurality of signal lines which are disposed corresponding to the display area and a plurality of inspection pads which are electrically connected to each of the signal lines and disposed corresponding to the non-display area; a second substrate facing the first substrate and including a light blocking layer which is disposed corresponding to the non-display area; and an encapsulation layer disposed, corresponding to the non-display area, between the first substrate and the second substrate, wherein each of the inspection pads includes a plurality of opening portions defined spaced apart from each other and a metal pattern portion surrounding the opening portions.

In an embodiment, a maximum width of each of the opening portions may be about 20 μm or less in a top plan view parallel to the first substrate.

In an embodiment, in the top plan view, a ratio of a surface area of the opening portions to entire area of the opening portions and the metal pattern portion may be about 35% or more.

In an embodiment, in the top plan view, a maximum gap between the neighboring opening portions of the opening portions may be about 30 μm or less.

In an embodiment, the inspection pads may inspect whether there are open/short circuits in the signal lines.

In an embodiment, the metal pattern portion may include an opaque metal material.

In an embodiment, the encapsulation layer may be disposed on the inspection pads and may fill the opening portions.

In an embodiment, the encapsulation layer, and the light blocking layer may overlap each other.

In an embodiment, the inspection pads may be arranged spaced apart from each other in one direction.

In an embodiment, the signal lines may extend in one direction and are arranged spaced apart from each other in the other direction crossing the one direction, and a distance between the neighboring signal lines may be greater than a minimum distance between the neighboring inspection pads.

In an embodiment, the inspection pads may be aligned in a plurality of inspection pad rows, and the inspection pad rows may be arranged parallel each other in a top plan view.

In an embodiment, the inspection pad rows may include a first inspection pad row and a second inspection pad row, which are sequentially arranged in a direction away from the display area, wherein the inspection pads connected to odd-numbered signal lines of the signal lines may be arranged in the first inspection pad row, and the inspection pads connected to even-numbered signal lines of the signal lines may be arranged in the second inspection pad row, or the inspection pads connected to the even-numbered signal lines of the signal lines may be arranged in the first inspection pad row, and the inspection pads connected to the odd-numbered signal lines of the signal lines may be arranged in the second inspection pad row.

In an embodiment, the display device may further include a plurality of scan lines which are disposed between the plurality of signal lines and the plurality of inspection pads or which are spaced apart from the plurality of signal lines and disposed on ends of the plurality of inspection pads.

In an embodiment of the present disclosure, a display device comprises a base substrate; a plurality of gate lines disposed on the base substrate and extending in a first direction; a plurality of data lines extending in a second direction crossing the first direction; and each of a plurality of inspection pads which are respectively connected to each of the plurality of data lines on ends of the plurality of data lines and each of which has a plurality of opening portions defined therein.

In an embodiment, a maximum width of each of the plurality of opening portions may be about 20 μm or less in a top plan view parallel to the base substrate.

In an embodiment, in the top plan view, a ratio of a surface area of the opening portions to an area of each of the inspection pads may be about 35% or more.

In an embodiment, the opening portions may be defined spaced apart from each other in the top plan view, and a maximum distance between the neighboring opening portions may be about 30 μm or less.

In an embodiment, the display device may include: a display area defined as an area in which the plurality of gate lines intersect the plurality of data lines; and a non-display area adjacent to the display area to surround the display area, wherein the inspection pads are disposed in the non-display area.

In an embodiment, the display device may further include an encapsulation layer which is disposed corresponding to the non-display area, wherein the encapsulation layer covers an entirety of the inspection pads.

In an embodiment, the inspection pads may be made of an opaque metal material.

BRIEF DESCRIPTION OF THE DRAWINGS

The accompanying drawings are included to provide a further understanding of the present disclosure, and are incorporated in and constitute a part of this specification. The drawings illustrate exemplary embodiments of the present disclosure and, together with the description, serve to explain principles of the present disclosure. In the drawings.

DETAILED DESCRIPTION

Figure 1:
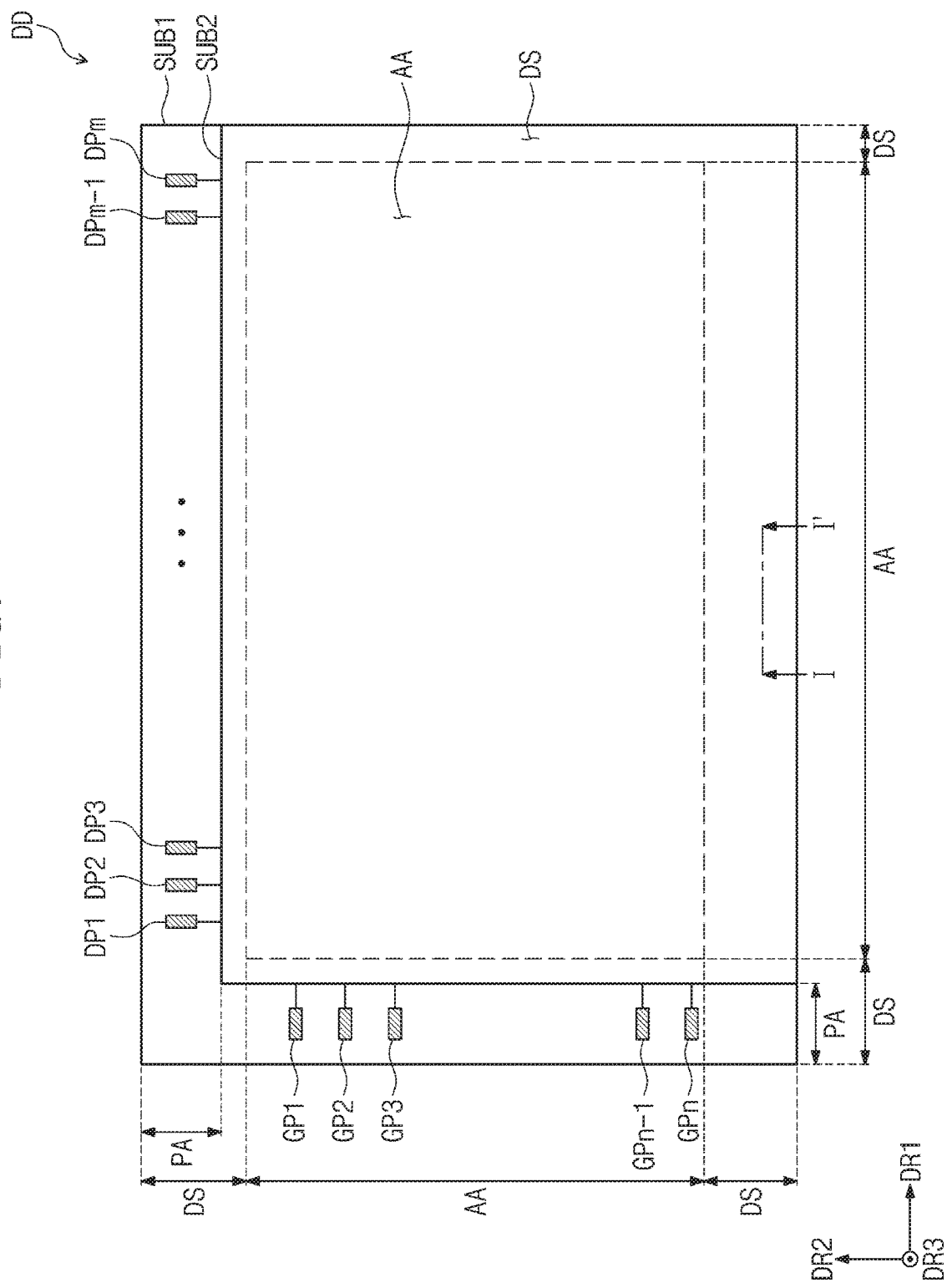
FIG. 1 is a top plan view of a display device of an embodiment.

Since an embodiment of the present disclosure may have various modifications and diverse shapes, particular embodiments are illustrated in the drawings and are described in the detailed description. However, this does not intent to limit the present disclosure within particular embodiments, and it should be understood that the present disclosure covers all the modifications, equivalents, and replacements within the idea and technical scope of the present disclosure.

It will be understood that when an element (or a region, a layer, a portion, or the like) is referred to as being "on", "connected to" or "coupled to" another element or layer, it can be directly disposed on, connected or coupled to the other element or layer, or intervening elements may be present.

However, in this application, being "disposed directly on" may mean that there is no additional layer, film, region, plate, or the like between a part and another part such as a layer, a film, a region, a plate, or the like. For example, being "disposed directly on" may mean that two layers or two members are disposed without using an additional member such as an adhesive member, therebetween.

Like numbers refer to like elements throughout. The thickness, the ratio, and the dimension of elements are exaggerated for effective description of the technical contents.

The term "and/or" includes any and all combinations of one or more of the associated listed items.

It will be understood that, although the terms first, second, etc. may be used herein to describe various elements, these elements should not be limited by these terms. These terms are only used to distinguish one element from another element. For example, a first element may be referred to as a second element, and similarly, a second element may be referred to as a first element without departing from the teachings of the present disclosure. The singular forms are intended to include the plural forms as well, unless the context clearly indicates otherwise.

Also, terms of "below", "lower", "above", "upper" may be used to describe the relationships of the components illustrated in the drawings. These terms have a relative concept, and are described on the basis of the directions illustrated in the drawings. In the specification, being "disposed on" may represent not only being disposed on the top surface but also being disposed on the bottom surface.

Unless otherwise defined, all terms (including technical and scientific terms) used herein have the same meaning as commonly understood by one of ordinary skill in the art to which the present disclosure belongs. Also, terms as defined in a commonly used dictionary should be construed as having the same meaning as in an associated technical context, and unless ideally or excessively construed as having formal meaning, the terms may be construed as defined apparently herein.

It will be further understood that the terms "includes" and/or "including", when used in this specification, specify the presence of stated features, integers, steps, operations, elements, components, or a combination thereof, but do not preclude the presence or addition of one or more other features, integers, steps, operations, elements, components, or combinations thereof.

Hereinafter, a display device according to an embodiment of the present disclosure will be described with reference to the drawings.

Figure 2:
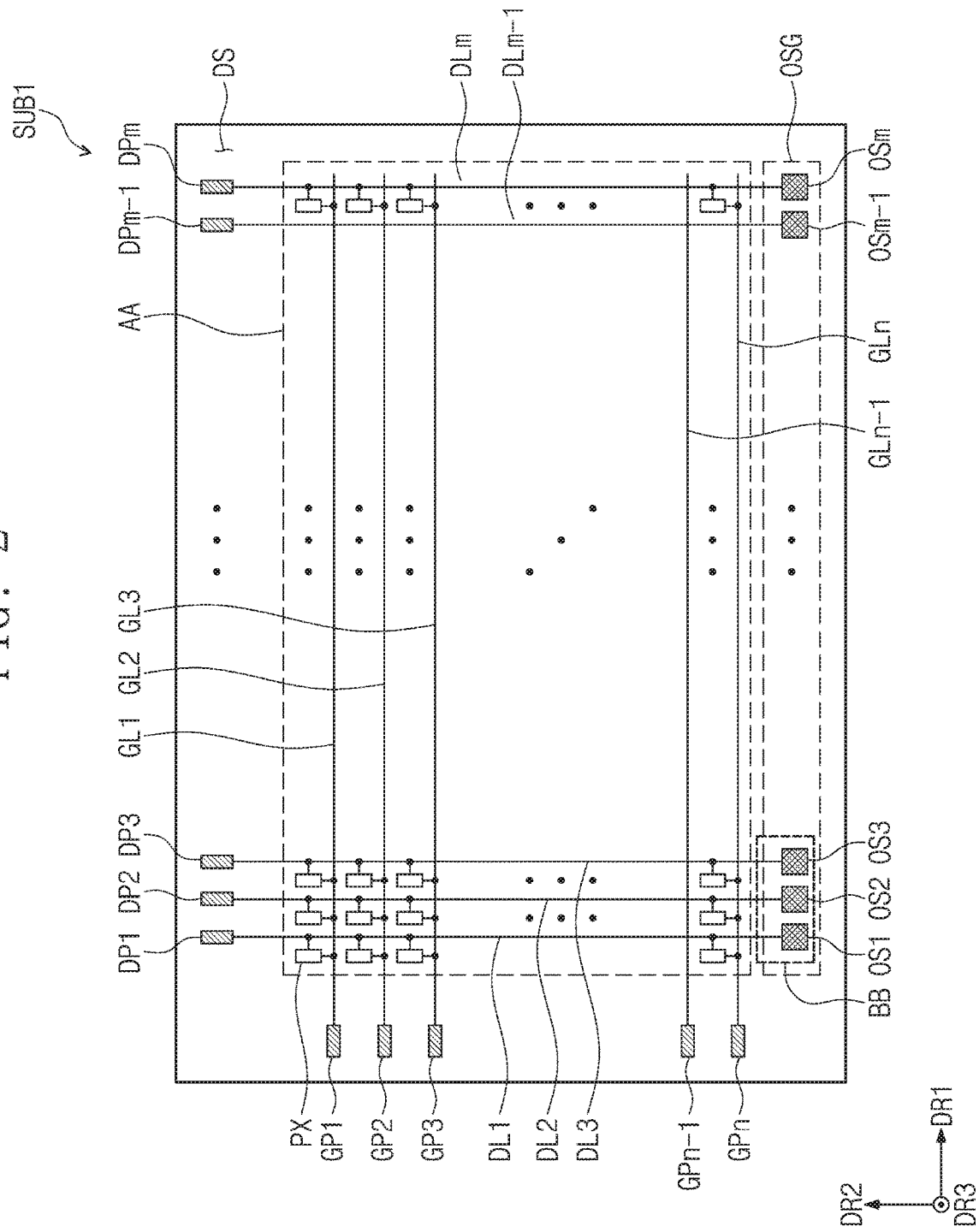
FIG. 2 is a top plan view showing a portion of a display device according to an embodiment.
Figure 3:
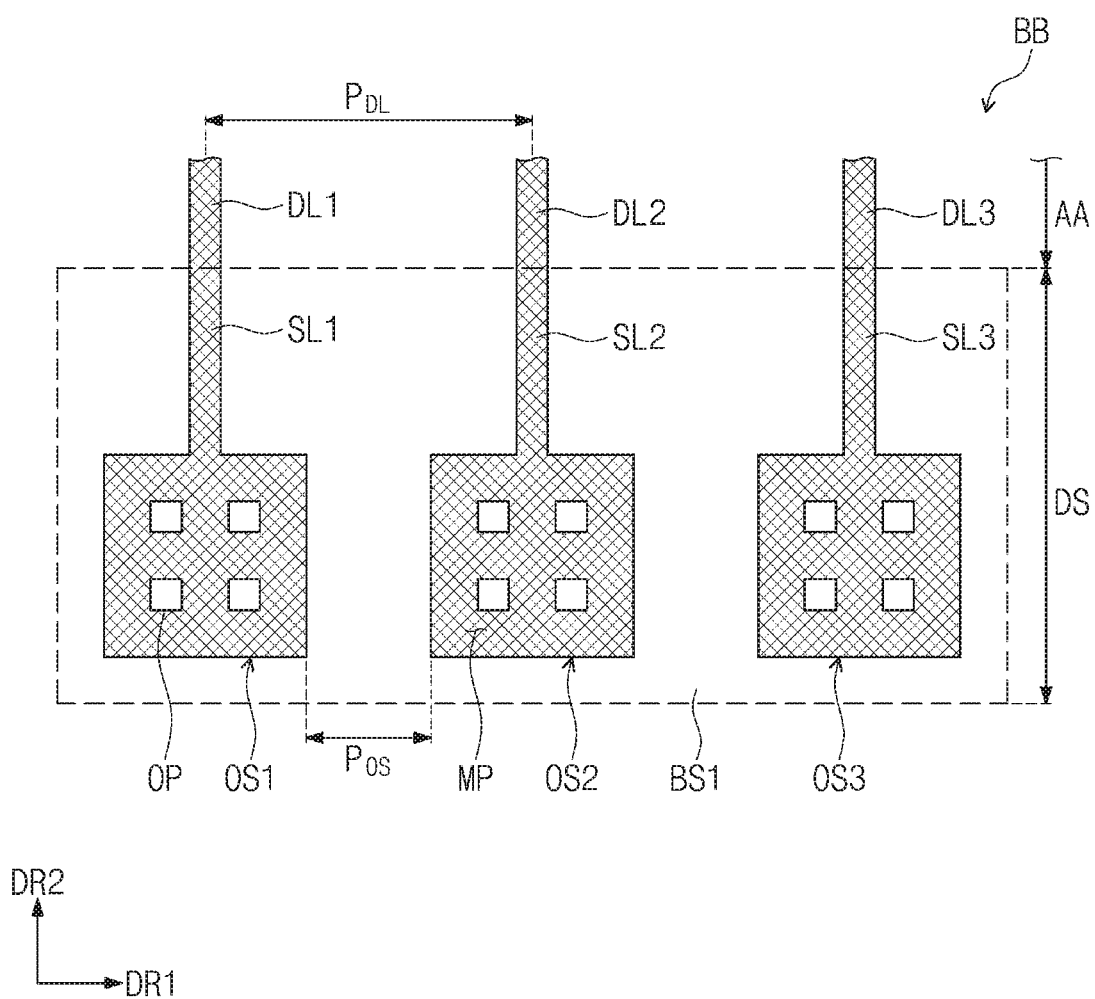
FIG. 3 is a top plan view showing a portion of a display device according to an embodiment.
Figure 4:
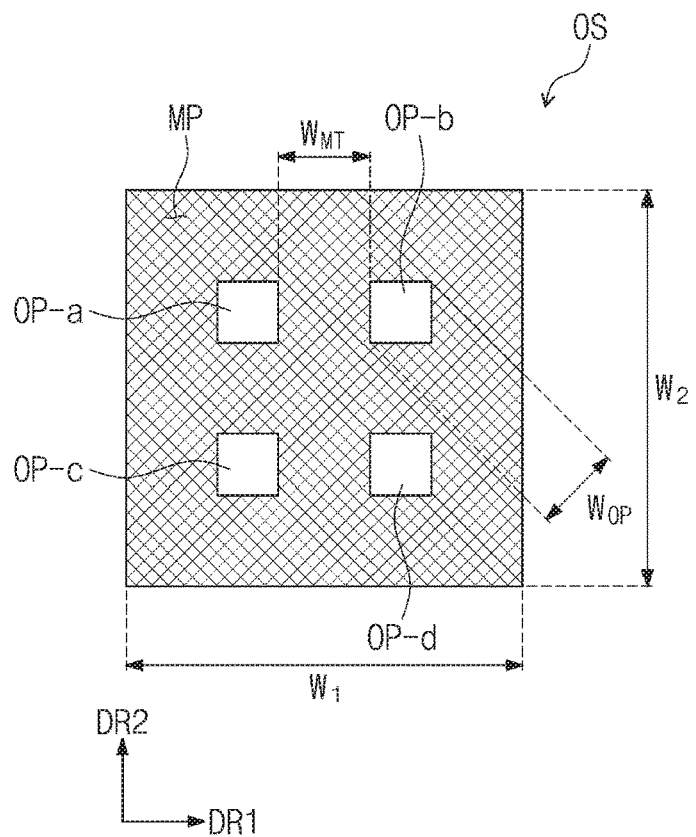
FIG. 4 is a top plan view showing a portion of a display device according to an embodiment.
Figure 5:
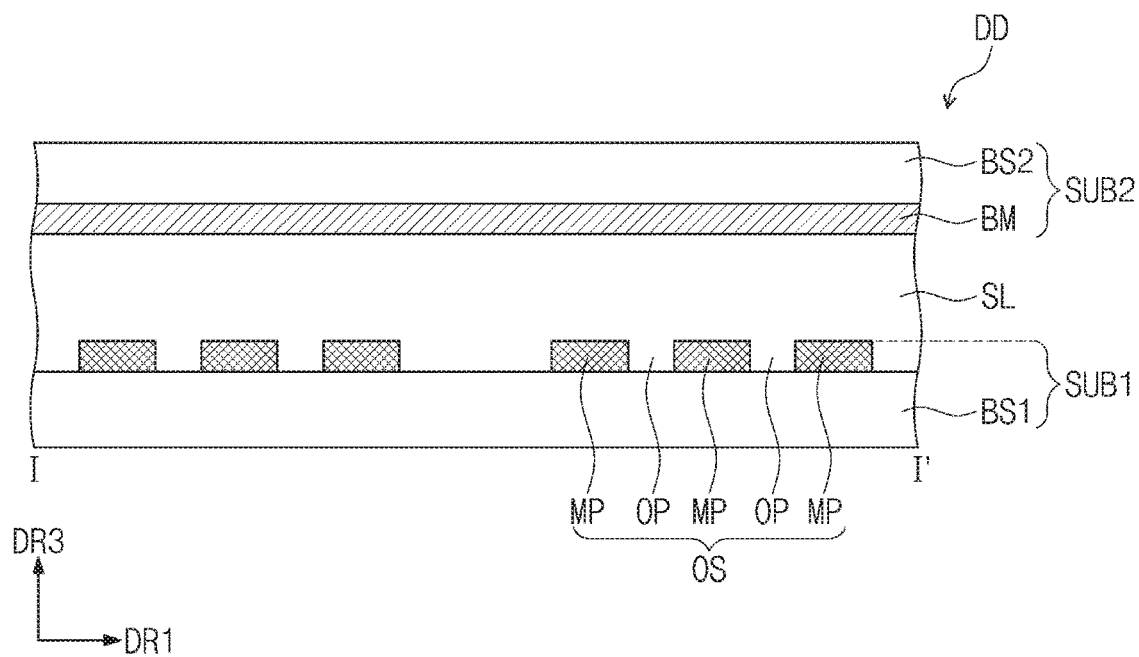
FIG. 5 is a cross-sectional view showing a portion of the display device according to an embodiment.

FIG. 1 is a top plan view showing a display device of an embodiment. FIG. 2 is a top plan view showing a portion of the display device of the embodiment illustrated in FIG. 1. FIG. 3 is a top plan view showing a portion of a first substrate of a display device according to an embodiment. FIG. 4 is a top plan view showing an inspection pad according to an embodiment. FIG. 5 is a cross-sectional view showing a display device of an embodiment.

A display device DD of an embodiment may be a large electronic apparatus such as a television, a monitor, or an outdoor advertisement board. Also, the display device DD may be a small-to-medium electronic apparatus such as a personal computer, a laptop computer, a personal digital terminal, a vehicle navigation unit, a game console, a smart phone, a tablet, and a camera. Also, these apparatuses are merely provided as embodiments, and other electronic apparatuses may be employed as long as not departing from the present disclosure.

The display device DD may be flexible. The term "flexible" indicates a property of being bendable, and may encompass various structures from a completely foldable structure to a structure bendable to a several-nanometer degree. For example, the display device DD may be a curved display device or a foldable display device. Also, the display device DD may be rigid.

In an embodiment, the display device DD may be a liquid crystal display device. For example, the display device DD of an embodiment may include a liquid crystal display panel and a light source unit (not shown) for supplying light to the liquid crystal display panel. Here, the display device DD of an embodiment in this specification is illustratively described as a liquid crystal display device, but the embodiment is not limited. The display device DD of an embodiment may be a self-emissive display device including an organic light emitting element, a quantum dot light emitting element, or the like.

The display device DD of an embodiment includes a display area AA and a non-display area DS. The display area AA may be a portion corresponding to an active area that displays an image in the display device DD. The image may be provided in a third directional axis DR3 perpendicular to a plane defined by a first directional axis DR1 and a second directional axis DR2. The non-display area DS is a portion adjacent to the display area AA and may be disposed on at least one side of the display area AA. The non-display area DS may be a portion which is disposed to surround the display area AA. The non-display area DS may be referred to as a dead space.

The display device DD may include a first substrate SUB1 and a second substrate SUB2 facing the first substrate SUB1. Also, although not illustrated, the display device DD may include, for example, a liquid crystal layer (not shown) disposed between the first substrate SUB1 and the second substrate SUB2. The display area AA of the display device DD and the non-display area DS adjacent to the display area AA may correspond to a display area AA and a non-display area DS of the first substrate SUB1.

The display device DD include a first substrate SUB1 in which a plurality of signal lines GL1, . . . , and GLn, or DL1, . . . , and DLm are disposed. The first substrate SUB1 may include a first base substrate BS1, a plurality of signal lines GL1, . . . , and GLn, or DL1, . . . , and DLm disposed on the first base substrate BS1, and a pads GP1 to GPn, DP1 to DPm, or OS1 to OSm connected to the plurality of signal lines GL1, . . . , and GLn, or DL1, . . . , and DLm.

The second substrate SUB2 may include a second base substrate BS2 and a light blocking layer BM. The light blocking layer BM may be provided on one surface of the second base substrate BS2. The light blocking layer BM may be disposed on a bottom surface of the second base substrate BS2 adjacent to the first base substrate BS1. Here, although not illustrated, the second substrate SUB2 may include a color filter layer (not shown).

The signal lines GL1, . . . , and GLn, or DL1, . . . , and DLm may be referred to as a plurality of gate lines GL1, GL2, GL3, . . . , GLn−1, and GLn or a plurality of data lines DL1, DL2, DL3, . . . , DLm−1, and DLm. Also, in an embodiment, each of n and m may independently have an integer of 5 or more.

The plurality of gate lines GL1, GL2, GL3, . . . , GLn−1, and GLn may extend in the first directional axis DR1 and may be spaced apart from each other in the second directional axis DR2 crossing the first directional axis DR1. Also, the plurality of data lines DL1, DL2, DL3, . . . , DLm−1, and DLm may extend in the second directional axis DR2 and may be arranged spaced apart from each other in the first directional axis DR1. The gate lines GL1, GL2, GL3, . . . , GLn−1, and GLn and the data lines DL1, DL2, DL3, . . . , DLm−1, and DLm define pixel areas, and in the pixel areas, pixels PX for displaying an image may be provided.

Here, the display area AA of the display device DD may be a portion defined by an area in which the plurality of gate lines GL1, GL2, GL3, . . . , GLn−1, and GLn and the plurality of data lines DL1, DL2, DL3, . . . , DLm−1, and DLm intersect each other.

The display device DD may include a plurality of gate pads GP1, GP2, GP3, . . . , GPn−1, and GPn correspondingly connected on ends of each of the gate lines GL1, GL2, GL3, . . . , GLn−1, and GLn, and a plurality of data pads DP1, DP2, DP3, . . . , DPm−1, and DPm correspondingly connected on ends of each of the data lines DL1, DL2, DL3, . . . , DLm−1, and DLm. A portion in which the gate pads GP1, GP2, GP3, . . . , GPn−1, and GPn and the data pads DP1, DP2, DP3, . . . , DPm−1, and DPm are disposed may be referred to as a pad area PA. The pad area PA may be a portion included in the non-display area DS.

Additionally, the display device DD of an embodiment may include a plurality of inspection pads OS1, OS2, OS3, . . . , OSm−1, and OSm disposed corresponding to the non-display area DS. Referring to FIGS. 1 and 2, in the display device DD of an embodiment, the inspection pads OS1, OS2, OS3, . . . , OSm−1, and OSm may be connected to the respective data lines DL1, DL2, DL3, . . . , DLm−1, and DLm. The inspection pads OS1, OS2, OS3, . . . , OSm−1, and OSm may be electrically connected to ends of each of the data lines DL1, DL2, DL3, . . . , DLm−1, and DLm. However, the embodiment is not limited. For example, the inspection pads OS1, OS2, OS3, . . . , OSm−1, and OSm may be correspondingly connected on ends of each of the gate lines GL1, GL2, GL3, . . . , GLn−1, and GLn. Furthermore, unlike shown in the figure, the inspection pads OS1, OS2, OS3, . . . , OSm−1, and OSm may be electrically connected to each of the gate lines GL1, GL2, GL3, . . . , GLn−1, and GLn and each of the data lines DL1, DL2, DL3, . . . , DLm−1, and DLm, and may be disposed in the non-display area DS adjacent to one side of the display area AA.

The inspection pads OS1, OS2, OS3, . . . , OSm−1, and OSm may be test pads for testing whether the connected signal lines GL1, . . . , and GLn, or DL1, . . . , and DLm are properly operated. The inspection pads OS1, OS2, OS3, . . . , OSm−1, and OSm may be a portion for testing whether there are open/short circuits in the signal lines GL1, . . . , and GLn, or DL1, . . . , and DLm. Testers (i.e., probes_) of an inspection device are connected to the inspection pads OS1, OS2, OS3, . . . , OSm−1, and OSm to determine whether the connected signal lines GL1, . . . , and GLn, or DL1, . . . , and DLm are properly operated. When a failure signal is detected, defects of the signal lines GL1, . . . , and GLn, or DL1, . . . , and DLm may be eliminated through a rework operation.

The inspection pads OS1, OS2, OS3, . . . , OSm−1, and OSm may be arranged spaced apart from each other in one direction. For example, in an embodiment, the inspection pads OS1, OS2, OS3, . . . , OSm−1, and OSm may be arranged spaced apart from each other in the first directional axis DR1 which is the direction in which the data lines DL1, DL2, DL3, . . . , DLm−1, and DLm are spaced apart.

In an embodiment, the signal lines GL1, . . . , and GLn, or DL1, . . . , and DLm may extend in one direction and may be spaced apart from each other in the other direction crossing the one direction. For example, in an embodiment, the data lines DL1, DL2, DL3, . . . , DLm−1, and DLm connected to the inspection pads OS1, OS2, OS3, . . . , OSm−1, and OSm may extend in the second directional axis DR2, and may be spaced apart from each other in the first directional axis DR1.

In an embodiment, a distance between the neighboring signal lines GL1, . . . , and GLn, or DL1, . . . , and DLm of the spaced signal lines GL1, . . . , and GLn, or DL1, . . . , and DLm may be greater than a minimum distance between the neighboring inspection pads OS1, OS2, OS3, . . . , OSm−1, and OSm. For example, in an embodiment, a distance $P_{DL}$ between the data lines DL1, DL2, DL3, . . . , DLm−1, and DLm may be greater than the minimum distance $P_{OS}$ between the neighboring inspection pads OS1, OS2, OS3, . . . , OSm−1, and OSm. The minimum distance $P_{OS}$ between the neighboring inspection pads OS1, OS2, OS3, ..., OSm−1, and OSm may vary according to resolution.

In an embodiment, the gate lines GL1, GL2, GL3, ..., GLn−1, and GLn may be made of a metal. In an embodiment, the gate lines GL1, GL2, GL3, ..., GLn−1, and GLn may be made of an opaque metal material. The gate lines GL1, GL2, GL3, ..., GLn−1, and GLn may be made of nickel, chrome, molybdenum, aluminum, titanium, copper, tungsten, and an alloy of the above. The gate lines GL1, GL2, GL3, ..., GLn−1, and GLn may be made of a single-layer film or a multi-layered film in which a metal is used. For example, the gate lines GL1, GL2, GL3, ..., GLn−1, and GLn may be a triple-layered film in which molybdenum, aluminum, and molybdenum are sequentially laminated to each other or a double-layered film in which titanium and copper are sequentially laminated to each other. Alternatively, the gate lines GL1, GL2, GL3, ..., GLn−1, and GLn may be a single-layer film made of an alloy of titanium and copper.

The data lines DL1, DL2, DL3, ..., DLm−1, and DLm may be made of nickel, chrome, molybdenum, aluminum, titanium, copper, tungsten, and an alloy of the above. In an embodiment, the data lines DL1, DL2, DL3, ..., DLm−1, and DLm may be made of an opaque metal material. The data lines DL1, DL2, DL3, ..., DLm−1, and DLm may be made of a single-layer film or a multi-layered film in which a metal is used. For example, the data lines DL1, DL2, DL3, ..., DLm−1, and DLm may be a double-layered film in which titanium and copper are sequentially laminated to each other. Alternatively, the data lines DL1, DL2, DL3, ..., DLm−1, and DLm may be a single-layered film made of an alloy of titanium and copper.

In an embodiment, the inspection pads OS1, OS2, OS3, ..., OSm−1, and OSm may be formed through the same process as in the signal lines connected thereto. For example, in an embodiment, the inspection pads OS1, OS2, OS3, ..., OSm−1, and OSm may be electrically connected to the data lines DL1, DL2, DL3, ..., DLm−1, and DLm and may be formed through the same process as in the data lines DL1, DL2, DL3, ..., DLm−1, and DLm. The inspection pads OS1, OS2, OS3, ..., OSm−1, and OSm may be made of an opaque metal material. For example, the inspection pads OS1, OS2, OS3, ..., OSm−1, and OSm may be made of nickel, chrome, molybdenum, aluminum, titanium, copper, tungsten, and an alloy of the above.

In an embodiment, a plurality of opening portions OP-a, OP-b, OP-c, and OP-d may be defined in each of the inspection pads OS1, OS2, OS3, ..., OSm−1, and OSm. Each of the inspection pads OS1, OS2, OS3, ..., OSm−1, and OSm may include the plurality of opening portions OP-a, OP-b, OP-c, and OP-d and a metal pattern portion MP surrounding the plurality of opening portions OP-a, OP-b, OP-c, and OP-d. The metal pattern portion MP may be made of an opaque metal material.

Referring to the illustrations of FIGS. 3 and 4, the plurality of opening portions OP-a, OP-b, OP-c, and OP-d defined in each of the inspection pads OS1, OS2, OS3, and OS may be spaced apart from each other in a plane defined by the first directional axis DR1 and the second directional axis DR2. This specification illustrates that four opening portions OP-a, OP-b, OP-c, and OP-d are defined in each of the inspection pads OS1, OS2, OS3, and OS, but the embodiment is not limited thereto. The number of the opening portions OP-a, OP-b, OP-c, and OP-d may vary according to the size and shape of the inspection pad OS.

FIGS. 3 and 4 illustrate that each of the inspection pads OS1, OS2, OS3, and OS has a quadrangular shape in a top plan view, but the embodiment is not limited. A width $W_1$ of the inspection pad OS in the first directional axis DR1 and a width $W_2$ of the inspection pad OS in the second directional axis DR2 may be independently about 50 μm to about 100 μm. The width $W_1$ in the first directional axis DR1 and the width $W_2$ in the second directional axis DR2 may be equal to or different from each other. However, the embodiment is not limited thereto. The size of each of the inspection pads OS1, OS2, OS3, and OS may vary according to the resolution of the display device DD and the size of a probe PB (see FIG. 6) of an inspection device.

Also, the present disclosure illustrates that each of the opening portions OP-a, OP-b, OP-c, and OP-d defined in the inspection pad OS has a quadrangular shape in a top plan view, but the embodiment is not limited. For example, in other embodiments, each of the opening portions OP-a, OP-b, OP-c, and OP-d may have a circular, oval, polygonal shape in a top plan view.

Here, scan lines SL1, SL2, and SL3 may be additionally disposed between the signal lines GL1, ..., and GLn, or DL1, ..., and DLm and the inspection pads OS1, OS2, OS3, ..., OSm−1, and OSm. The scan lines SL1, SL2, and SL3 may extend from the signal lines GL1, ..., and GLn, or DL1, ..., and DLm. In an embodiment, the scan lines SL1, SL2, and SL3 may be formed through the same process as in the data lines DL1, DL2, DL3, ..., DLm−1, and DLm and may extend from the data lines DL1, DL2, DL3, ..., DLm−1, and DLm. A signal may be transmitted to the scan lines SL1, SL2, and SL3 to determine whether the data lines DL1, DL2, DL3, ..., DLm−1, and DLm are properly operated. On the basis of the waveform detected by transmitting the signal to the scan lines SL1, SL2, and SL3, it is sensed whether there is an abnormality in the data lines DL1, DL2, DL3, ..., DLm−1, and DLm. Additionally, by bringing a probe PB (see FIG. 6) of the inspection device into contact with the inspection pad OS, a data line having a defect may be finally determined.

Figure 6:
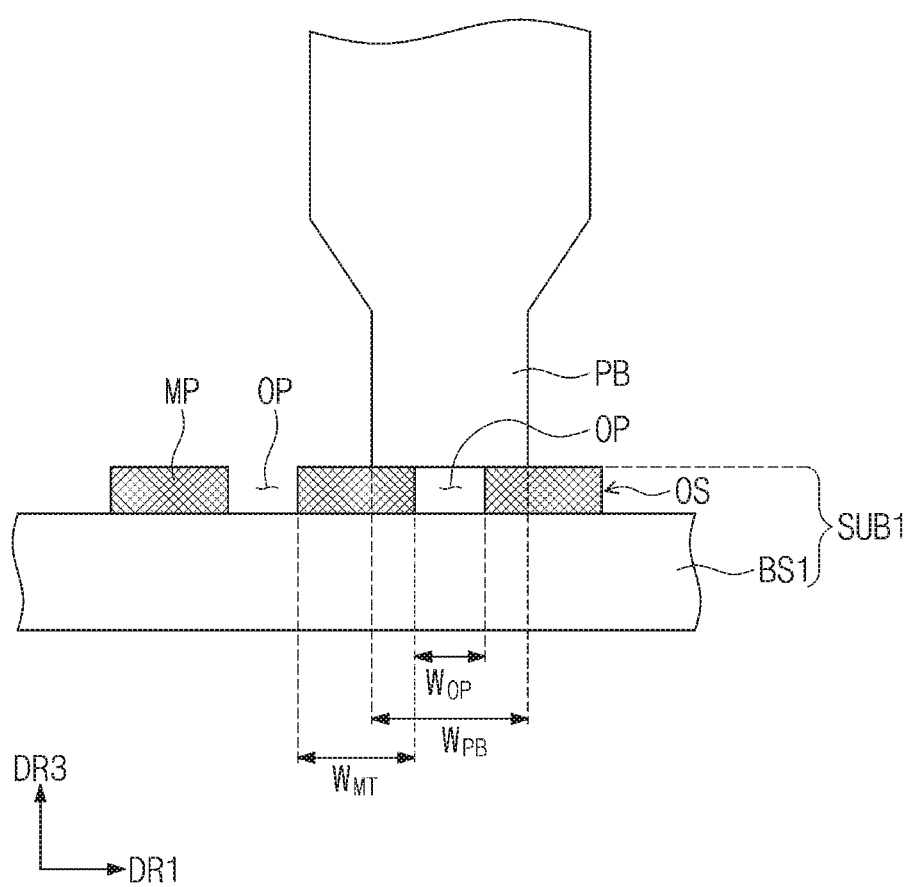
FIG. 6 is a view schematically showing a method for testing a signal line using an inspection pad.

FIG. 6 is a view schematically showing a test performed by bringing the probe PB of the inspection device into contact with the inspection pad OS included in the display device DD of an embodiment. In an embodiment, a maximum width $W_{OP}$ of each of the opening portions OP defined in the inspection pad OS may be less than a width $W_{PB}$ of an end portion of the probe PB of the inspection device in contact with the inspection pad OS. Referring to FIG. 6, the maximum width $W_{OP}$ of the opening portion OP in the inspection pad OS is made less than the width of the end portion of the probe PB of the inspection device, and this may prevent an error from occurring in an inspection result depending on a position where the probe PB of the inspection device is in contact therewith. For example, the maximum width $W_{OP}$ of each of the opening portions OP may be about 20 μm or less. When the maximum width $W_{OP}$ of each of the opening portions OP is about 20 μm or more, the probe PB may come into contact with the opening portion OP. In this case, it may be difficult to determine whether there is a failure in the signal line by using the inspection pad OS. Additionally, a distance $W_{MT}$ between the neighboring opening portions OP in the inspection pad OS may be about 30 μm or less. Here, the distance $W_{MT}$ between the neighboring opening portions OP in the inspection pad OS may represent a width of a metal pattern portion disposed between the neighboring opening portions OP.

Referring back to FIGS. 1, 2, 3, 4, and 5, the second substrate SUB2 may include the second base substrate BS2 and the light blocking layer BM. The second base substrate BS2 may include an insulating material. For example, the second base substrate BS2 may be a silicon substrate, a plastic substrate, an insulating film, a laminated structure, a glass substrate, or a quartz substrate.

The light blocking layer BM may be disposed on the bottom surface of the second base substrate BS2, and may be disposed in the non-display area DS of the display device DD. The light blocking layer BM may be a black matrix. The light blocking layer BM may be made of an organic light blocking material or an inorganic light blocking material which includes a black pigment or a black dye. The light blocking layer BM may prevent a light leakage and may cover components such as the inspection pads OS1, OS2, OS3, . . . , OSm−1, and OSm disposed in the non-display area DS.

An encapsulation layer SL may be disposed between the first substrate SUB1 and the second substrate SUB2. The encapsulation layer SL may be used as a coupling member that couples the first substrate SUB1 to the second substrate SUB2. The encapsulation layer SL may be formed by photo-curing an adhesive resin P-SL (see FIG. 7) that is provided in a liquid phase. For example, the encapsulation layer SL may be made of the adhesive resin P-SL (see FIG. 7) including at least one of a urethane-based resin, an acryl-based resin, or a silicon-based resin. The encapsulation layer SL may be disposed corresponding to the non-display area DS.

FIG. 5 is a cross-sectional view taken along line I-I' of FIG. 1. Referring to FIG. 5, the inspection pad OS may be disposed overlapping the encapsulation layer SL in the display device DD of an embodiment. The encapsulation layer SL may be disposed on the inspection pad OS and may fill the opening portions OP of the inspection pad OS. The encapsulation layer SL may cover the inspection pad OS.

Also, the encapsulation layer SL may overlap the light blocking layer BM. That is, in the display device DD of an embodiment, the light blocking layer BM, the encapsulation layer SL, and the inspection pad OS may be disposed overlapping each other in the non-display area DS. The embodiment may provide the display device DD in which the light blocking layer BM, the encapsulation layer SL, and the inspection pad OS overlap each other to reduce the surface area of the non-display area DS.

Here, the encapsulation layer SL may be formed by photo-curing the adhesive resin P-SL (see FIG. 7), and light for photo-curing the adhesive resin may be provided through the bottom surface of the first substrate SUB1.

Figure 7:
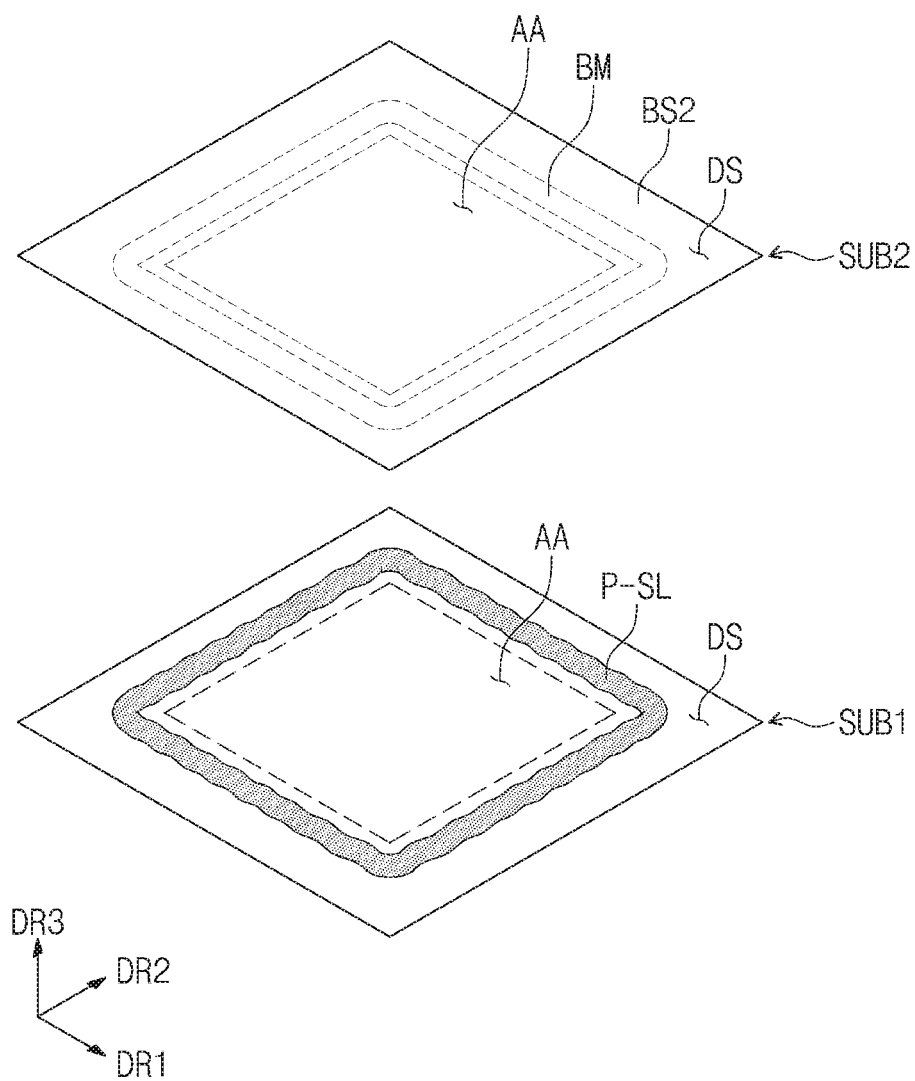
FIG. 7 is a view showing a portion of a method for manufacturing a display device according to an embodiment.
Figure 8:
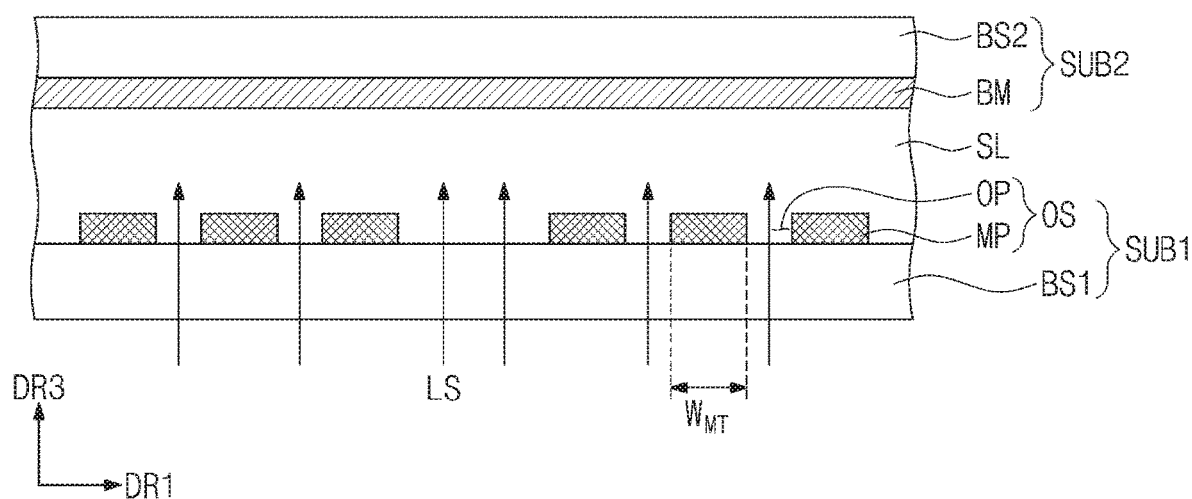
FIG. 8 is a view showing a portion of a method for manufacturing a display device according to an embodiment.

Each of FIGS. 7 and 8 is a view schematically showing a portion of a process of manufacturing a display device DD of an embodiment. FIG. 7 shows a process of bonding a first substrate SUB1 to a second substrate SUB2, and FIG. 8 shows a process of emitting light LS to form an encapsulation layer SL.

Referring to FIG. 7, the adhesive resin P-SL may be provided in a non-display area DS of the first substrate SUB1. The adhesive resin P-SL may be provided, in the non-display area DS, in a cured liquid phase.

Also, the second SUB2 may include a light blocking layer BM on a surface of the first substrate SUB1 adjacent to the first substrate SUB1. The light blocking layer BM may be provided on the bottom surface of the second base substrate BS2. The light blocking layer BM may be provided in a non-display area DS adjacent to the outside of a display area AA.

The adhesive resin P-SL may be provided to correspond to the light blocking layer BM. When the first substrate SUB1 and the second substrate SUB2 are bonded each other, the adhesive resin P-SL and the light blocking layer BM may overlap each other. Also, in an embodiment, a width of a region in which the adhesive resin P-SL is provided may be greater than a width of the light blocking layer BM in a top plan view.

FIG. 8 shows a process of forming the encapsulation layer SL by photo-curing the adhesive resin P-SL provided through the process illustrated in FIG. 7. The light LS for curing the adhesive resin P-SL may be provided from a lower side of the first substrate SUB1. The light LS for curing the adhesive resin P-SL may be light in the ultraviolet wavelength region. The light LS may be provided on the adhesive resin P-SL while passing through the first base substrate BS1. Also, in a region in which the inspection pad OS is disposed, the light LS may be provided while passing through each of an opening portions OP of the inspection pad OS. Thus, to sufficiently treat the adhesive resin P-SL with the light LS provided from the lower side of the first substrate SUB1, the surface area of opening portions OP in the inspection pad OS may be about 35% or more of the entire surface area of the inspection pad OS.

That is, in a top plan view, in a case in which a ratio of the surface area of the opening portions OP to the entire surface area of the inspection pad OS including both a metal pattern portion MP and the opening portions OP is about 35% or more, the adhesive resin P-SL may be sufficiently cured by the light LS provided through the opening portions OP. Therefore, the reliability of the display device DD may be secured. Furthermore, even though a width $W_{MT}$ of the metal pattern portion MP disposed between the neighboring opening portions OP is 30 μm or more, the light LS may be not sufficiently provided to the adhesive resin P-SL provided on the inspection pad OS due to the metal pattern portion MP including an opaque metal material. Thus, a cure degree of the adhesive resin P-SL may be degraded. That is, in an embodiment, when a gap $W_{MT}$ between the opening portions OP in the inspection pad OS is 30 μm or less, the encapsulation layer SL may be sufficiently cured.

The display device DD of the embodiment described with reference to FIGS. 1, 2, 3, 4, 5, 6, 7, and 8 includes the inspection pads OS1, OS2, OS3, . . . , OSm−1, and OSm to determine whether there are open/short circuits in the signal lines GL1, . . . , and GLn, or DL1, . . . , and DLm. The inspection pads OS1, OS2, OS3, . . . , OSm−1, and OSm are provided to overlap the light blocking layer BM and the encapsulation layer SL, and thus, the surface area of the non-display area DS may be minimized. Furthermore, the plurality of opening portions OP are defined in each of the inspection pads OS1, OS2, OS3, . . . , OSm−1, and OSm, and thus, the encapsulation layer SL is allowed to be sufficiently cured even in the region in which the opaque inspection pads OS1, OS2, OS3, . . . , OSm−1, and OSm are disposed. Therefore, the display device DD may exhibit favorable reliability characteristics.

Hereinafter, a display device according to an embodiment is described with reference to FIGS. 9, 10A, and 10B. When describing a display device according to an embodiment, the duplicated features with those of FIGS. 1, 2, 3, 4, 5, 6, 7, and 8 are not described again, but their differences will be mainly described.

Figure 9:
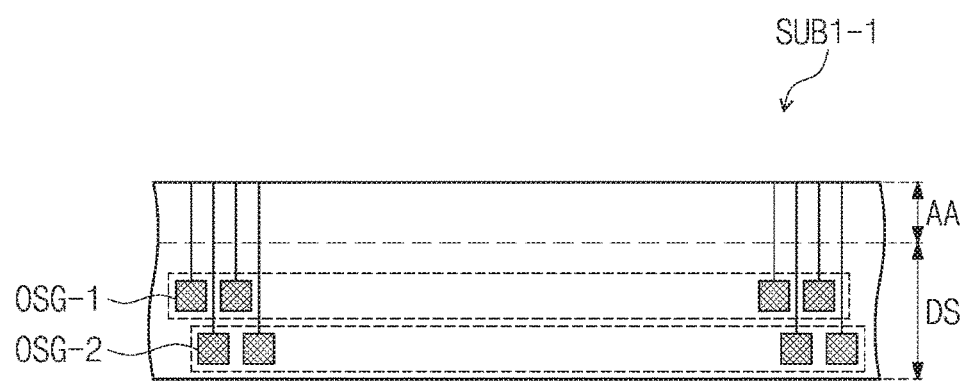
FIG. 9 is a top plan view showing a portion of a display device according to an embodiment.

FIG. 9 is a top plan view showing a portion of a first substrate SUB1-1 of the display device according to an embodiment. FIG. 10A is an enlarged view showing a portion of the first substrate SUB1-1 illustrated in FIG. 9. FIG. 10B is a top plan view showing an embodiment of a display device in which arrangement positions of scan lines SL1, SL2, SL3, and SL4 are different from those of FIG. 10A.

Figure 10A:
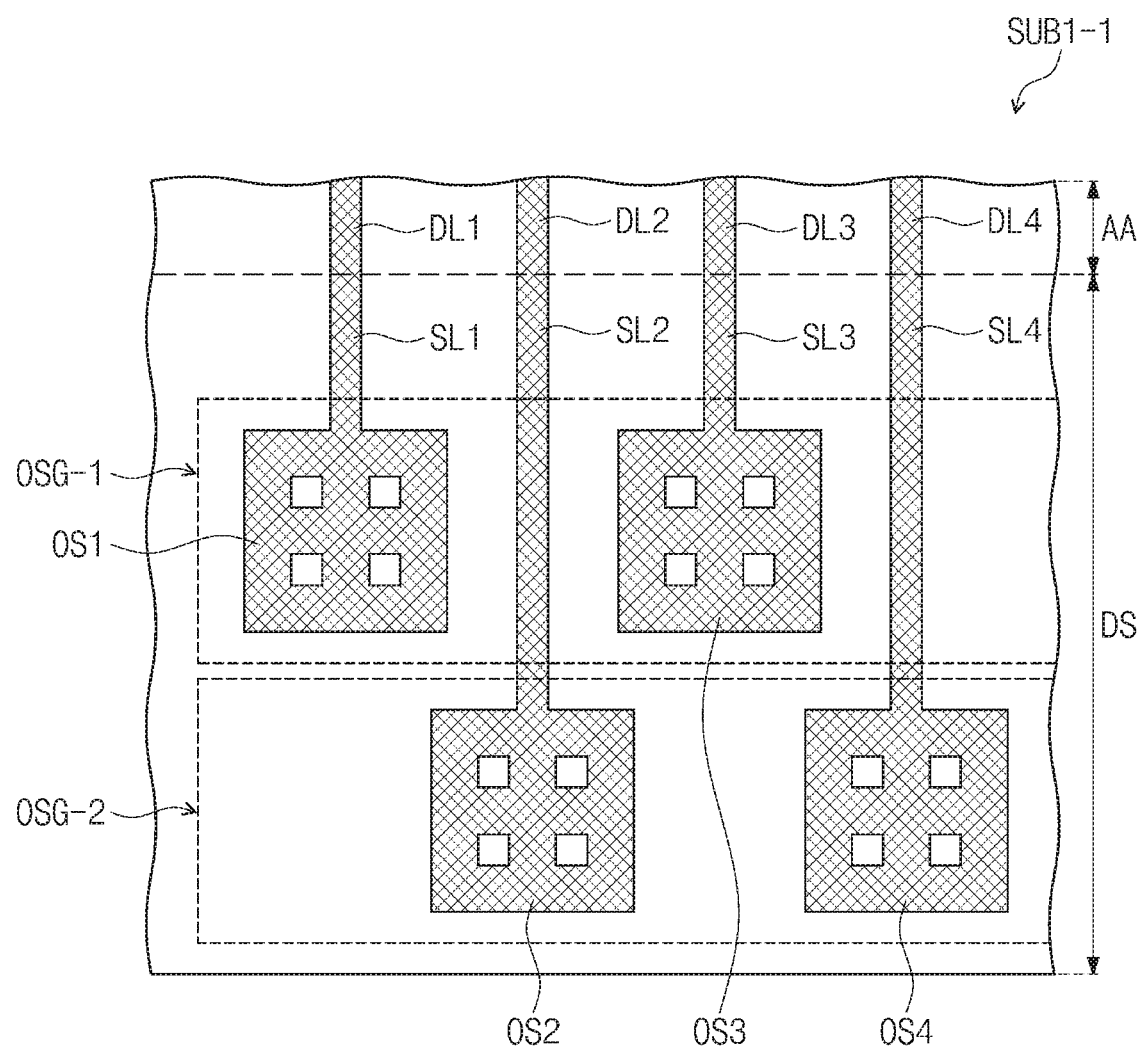
FIG. 10A is a top plan view showing a portion of a display device according to an embodiment.
Figure 10B:
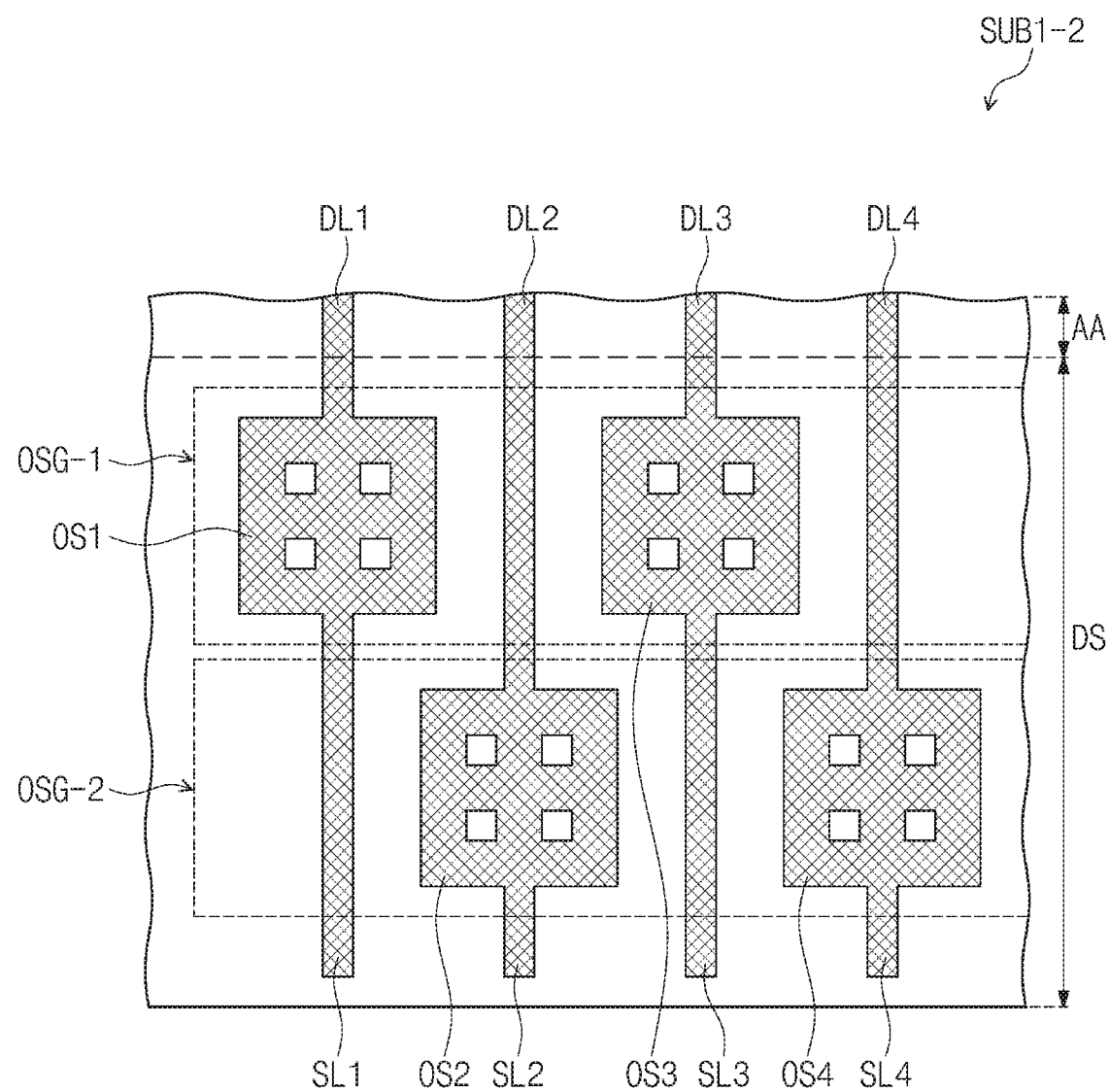
FIG. 10B is a top plan view showing a portion of a display device according to an embodiment.

Referring to FIGS. 9, 10A, and 10B, in an embodiment, a first substrate SUB1 may include a plurality of inspection pads OS1, OS2, OS3, and OS4 disposed on a first base substrate BS1. The inspection pads OS1, OS2, OS3, and OS4 may be electrically connected to signal lines. Here, in FIGS. 9, 10A, and 10B, the signal lines may be illustrated as data lines DL1, DL2, DL3, and DL4.

In an embodiment, the plurality of inspection pads OS1, OS2, OS3, and OS4 may be aligned in a plurality of inspection pad rows OSG-1 and OSG-2. In FIGS. 9, 10A, and 10B, the inspection pads OS1, OS2, OS3, and OS4 are illustrated as being aligned in two inspection pad rows OSG-1 and OSG-2, but the embodiment is not limited. For example, the plurality of inspection pads OS1, OS2, OS3, and OS4 may be divided into three or more inspection pad rows and aligned. That is, as the resolution of a display device increases in an embodiment, there is a limitation in arranging and aligning the inspection pads OS1, OS2, OS3, and OS4 in a single row. Thus, to prevent the inspection pads OS1, OS2, OS3, and OS4 from overlapping each other, the inspection pads OS1, OS2, OS3, and OS4 may be divided into a plurality of inspection pad rows and aligned.

The plurality of inspection pad rows OSG-1 and OSG-2 may be arranged parallel to each other in a top plan view. The inspection pad rows OSG-1 and OSG-2 include a first inspection pad row OSG-1 and a second inspection pad row OSG-2, which are sequentially arranged in a direction away from a display area AA. Referring to FIGS. 9, 10A, and 10B, in an embodiment, the inspection pads OS1 and OS3 connected to odd-numbered signal lines of the signal lines DL1 and DL3 may be arranged in the first inspection pad row OSG-1, and the inspection pads OS2 and OS4 connected to even-numbered signal lines of the signal lines DL2 and DL4 are arranged in the second inspection pad row OSG-2. However, unlike shown in the figures, the embodiment is not limited. The inspection pads OS2 and OS4 connected to even-numbered signal lines of the signal lines DL2 and DL4 may be arranged in the first inspection pad row OSG-1, and the inspection pads OS1 and OS3 connected to odd-numbered signal lines of the signal lines DL1 and DL3 are arranged in the second inspection pad row OSG-2.

FIG. 10B is a top plan view showing a portion of a first substrate SUB1-2 of a display device according to an embodiment. The embodiment illustrated in FIG. 10B has a difference only in arrangement positions of scan lines SL1, SL2, SL3, and SL4 when compared to the embodiment illustrated in FIGS. 1, 2, 3, 4, 5, 6, 7, 8, 9, and 10A. The scan lines SL1, SL2, SL3, and SL4 may be disposed on end portions of the inspection pads OS1, OS2, OS3, and OS4 respectively, on one side thereof.

The display device of the embodiment includes, in the non-display area, the inspection pads for determining whether there are open/short circuits in the signal lines, and the inspection pads are provided to overlap the encapsulation layer and the like. Thus, the surface area of the non-display area may be minimized. Also, the plurality of opening portions are defined in each of the inspection pads, and thus, the light provided from the lower side of the substrate may be provided while passing through the opening portions. Accordingly, the encapsulation layer is allowed to be sufficiently cured even in the region in which the inspection pads are disposed, and thus, favorable reliability characteristics may be obtained.

The embodiment may provide the display device in which the inspection pads are disposed to overlap the encapsulation layer, thereby minimizing the dead space.

Also, in the embodiment, the plurality of opening portions are defined in the inspection pads, and the encapsulation layer is photo-cured through the opening portions. Thus, the excellent reliability may be exhibited even in the state in which the dead space is reduced.

Although described with reference to example embodiments of the present disclosure, it will be understood that various changes and modifications of the present disclosure may be made by one ordinary skilled in the art or one having ordinary knowledge in the art without departing from the spirit and technical field of the present disclosure as hereinafter claimed.

Hence, the technical scope of the present disclosure is not limited to the detailed descriptions in the specification but should be determined only with reference to the claims.

What is claimed is:

1. A display device including a display area and a non-display area adjacent to the display area, the display device comprising:
    a first substrate including a plurality of signal lines which are disposed corresponding to the display area and a plurality of inspection pads which are electrically connected to each of the signal lines and disposed corresponding to the non-display area and include a plurality of opening portions spaced apart from each other and penetrating through the inspection pads;
    a second substrate facing the first substrate and including a light blocking layer which is disposed corresponding to the non-display area; and
    an encapsulation layer disposed, corresponding to the non-display area, between the first substrate and the second substrate and filling the opening portions,
    wherein each of the inspection pads comprises a metal pattern portion surrounding the opening portions,
    wherein, in the top plan view, a ratio of a surface area of the opening portions to entire area of the opening portions and the metal pattern portion is about 35% or more, and
    wherein a maximum width of each of the opening portions is about 20 μm or less in a top plan view parallel to the first substrate.

2. The display device of claim 1, wherein, in the top plan view, the maximum width of each of the metal portions is about 30 μm or less.

3. The display device of claim 1, wherein the inspection pads inspect whether there are open/short circuits in the signal lines.

4. The display device of claim 1, wherein the metal pattern portion comprises an opaque metal material.

5. The display device of claim 1, wherein the encapsulation layer is disposed on the inspection pads.

6. The display device of claim 1, wherein the inspection pads, the encapsulation layer, and the light blocking layer overlap each other.

7. The display device of claim 1, wherein the inspection pads are arranged spaced apart from each other in one direction.

8. The display device of claim 1, wherein the signal lines extend in one direction and are arranged spaced apart from each other in the other direction crossing the one direction, and
    a distance between the neighboring signal lines is greater than a minimum distance between the neighboring inspection pads.

9. The display device of claim 1, wherein the inspection pads are aligned in a plurality of inspection pad rows, and
the inspection pad rows are arranged parallel each other in a top plan view.

10. The display device of claim 9, wherein the inspection pad rows include a first inspection pad row and a second inspection pad row, which are sequentially arranged in a direction away from the display area,
wherein the inspection pads connected to odd-numbered signal lines of the signal lines are arranged in the first inspection pad row, and the inspection pads connected to even-numbered signal lines of the signal lines are arranged in the second inspection pad row, or
the inspection pads connected to the even-numbered signal lines of the signal lines are arranged in the first inspection pad row, and the inspection pads connected to the odd-numbered signal lines of the signal lines are arranged in the second inspection pad row.

11. The display device of claim 1, further comprising a plurality of scan lines which are disposed between the plurality of signal lines and the plurality of inspection pads or which are spaced apart from the plurality of signal lines and disposed on ends of the plurality of inspection pads.

12. A display device comprising:
a base substrate;
a plurality of gate lines disposed on the base substrate and extending in a first direction;
a plurality of data lines extending in a second direction crossing the first direction;
each of a plurality of inspection pads which are respectively connected to each of the plurality of data lines on ends of the plurality of data lines and each of which has a plurality of opening portions penetrating through the inspection pads, and
an encapsulation layer disposed corresponding to the non-display area and filling the opening portions, and
wherein, in the top plan view, a ratio of a surface area of the opening portions to an area of each of the inspection pads is about 35% or more, and
wherein a maximum width of each of the opening portions is about 20 $\mu$m or less in a top plan view parallel to the first substrate.

13. The display device of claim 12, wherein the opening portions are defined spaced apart from each other in the top plan view, and
the maximum width of each of the metal portions is about 30 $\mu$m or less.

14. The display device of claim 12, comprising:
a display area defined as an area in which the plurality of gate lines intersect the plurality of data lines; and
a non-display area adjacent to the display area to surround the display area,
wherein the inspection pads are disposed in the non-display area.

15. The display device of claim 14, wherein the encapsulation layer covers an entirety of the inspection pads.

16. The display device of claim 12, wherein the inspection pads are made of an opaque metal material.

* * * * *